(12) United States Patent
Ryu (10) Patent No.: US 10,217,803 B2
(45) Date of Patent: Feb. 26, 2019

(54) ORGANIC LIGHT-EMITTING DISPLAY AND AN ELECTRONIC APPARATUS INCLUDING THE SAME

(71) Applicant: SAMSUNG DISPLAY CO., LTD., Yongin-si, Gyeonggi-Do (KR)

(72) Inventor: Sangjoon Ryu, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 1 day.

(21) Appl. No.: 15/459,667

(22) Filed: Mar. 15, 2017

(65) Prior Publication Data
US 2017/0271416 A1   Sep. 21, 2017

(30) Foreign Application Priority Data
Mar. 15, 2016   (KR) .................. 10-2016-0030947

(51) Int. Cl.
*H01L 25/16* (2006.01)
*H01L 27/32* (2006.01)
*H01L 51/52* (2006.01)

(52) U.S. Cl.
CPC ........ *H01L 27/3227* (2013.01); *H01L 25/167* (2013.01); *H01L 27/3258* (2013.01); *H01L 27/3262* (2013.01); *H01L 27/3276* (2013.01); *H01L 51/5253* (2013.01)

(58) Field of Classification Search
CPC .............. H01L 25/167; H01L 27/3227; H01L 27/3258; H01L 27/3262; H01L 27/3276; H01L 51/5253
See application file for complete search history.

(56) References Cited

U.S. PATENT DOCUMENTS

| 8,288,780 | B2 | 10/2012 | Yang et al. | |
|---|---|---|---|---|
| 8,461,591 | B2 * | 6/2013 | Lee ..................... | H01L 27/3262 257/59 |
| 2005/0258744 | A1 * | 11/2005 | Kwak .................. | G09G 3/3233 313/504 |
| 2009/0085859 | A1 * | 4/2009 | Song .................... | G09G 3/3406 345/102 |
| 2013/0135256 | A1 | 5/2013 | Hong et al. | |

(Continued)

FOREIGN PATENT DOCUMENTS

| JP | 2006098638 | * | 4/2006 |
|---|---|---|---|
| JP | 4848628 | | 10/2011 |

(Continued)

*Primary Examiner* — Tom Thomas
*Assistant Examiner* — Benjamin Tzu-Hung Liu
(74) *Attorney, Agent, or Firm* — F. Chau & Associates, LLC (57) ABSTRACT

An organic light-emitting diode display includes a substrate including an active area and a dead area surrounding the active area. The organic light-emitting diode display further includes a first organic light-emitting device disposed in the active area. The organic light-emitting diode display additionally includes a second organic light-emitting device disposed in the dead area, and a sensor configured to sense light emitted from the second organic light-emitting device. The first organic light-emitting device emits light in a first direction, and the second organic light-emitting device emits light in a second direction that is opposite to the first direction and is toward the sensor.

21 Claims, 11 Drawing Sheets

(56) References Cited

U.S. PATENT DOCUMENTS

2013/0187132 A1* 7/2013 Ando ................. H01L 51/0004
                                                                257/40
2016/0099298 A1   4/2016 Park et al.
2016/0226030 A1   8/2016 Heo
2017/0125728 A1* 5/2017 Dighde ............... H01L 27/3258

FOREIGN PATENT DOCUMENTS

| KR | 1020100047456 | 5/2010 |
| KR | 1020130057700 | 6/2013 |
| KR | 1020140140988 | 12/2014 |
| KR | 20160095300 | 8/2016 |

\* cited by examiner

ORGANIC LIGHT-EMITTING DISPLAY AND AN ELECTRONIC APPARATUS INCLUDING THE SAME

CROSS-REFERENCE TO RELATED APPLICATION

This application claims priority under 35 U.S.C. § 119 to Korean Patent Application No. 10-2016-0030947 filed on Mar. 15, 2016 in the Korean Intellectual Property Office, the disclosure of which is incorporated by reference herein in its entirety.

TECHNICAL FIELD

One or more exemplary embodiments of the present invention relate to a light-emitting device and a controlling method thereof, and more particularly to an organic light-emitting display and an electronic apparatus including the organic light-emitting display.

DISCUSSION OF THE RELATED ART

A display device is a device that displays an image. One type of display device currently under development is an organic light-emitting diode display.

The organic light-emitting diode display has a self-luminous characteristic, and unlike a liquid crystal display device, the organic light-emitting diode display does not include a separate light source. Thus, a thickness and a weight of a display device including the organic light-emitting diode display may be reduced. In addition, an organic light-emitting diode display has a relatively low power consumption, a high brightness, and a relatively fast response speed.

SUMMARY

According to an exemplary embodiment of the present invention, an organic light-emitting diode display includes a substrate including an active area and a dead area surrounding the active area. The organic light-emitting diode display further includes a first organic light-emitting device disposed in the active area. The organic light-emitting diode display additionally includes a second organic light-emitting device disposed in the dead area, and a sensor configured to sense light emitted from the second organic light-emitting device. The first organic light-emitting device emits light in a first direction, and the second organic light-emitting device emits light in a second direction that is opposite to the first direction and is toward the sensor.

In an exemplary embodiment of the present invention, a first pixel electrode of the first organic light-emitting device includes a material different from that of a second pixel electrode of the second organic light-emitting device.

In an exemplary embodiment of the present invention, a first distance from the substrate to a first pixel electrode of the first organic light-emitting device is different from a second distance from the substrate to a second pixel electrode of the second organic light-emitting device.

In an exemplary embodiment of the present invention, the organic light-emitting diode display further includes a first thin film transistor connected to the first organic light-emitting device, and an insulating layer covering the first thin film transistor.

In an exemplary embodiment of the present invention, one of a first pixel electrode of the first organic light-emitting device or a second pixel electrode of the second organic light-emitting device is disposed on the insulating layer, and another pixel electrode of the first pixel electrode and the second pixel electrode is disposed under the insulating layer.

In an exemplary embodiment of the present invention, the insulating layer includes an opening exposing the remaining pixel electrode disposed under the insulating layer.

In an exemplary embodiment of the present invention, the organic light-emitting diode display further includes a second thin film transistor connected to the second organic light-emitting device, the second thin film transistor being covered by the insulating layer.

In an exemplary embodiment of the present invention, a gate electrode, a source electrode, and a drain electrode of the second thin film transistor respectively include same materials as those of a gate electrode, a source electrode, and a drain electrode of the first thin film transistor.

In an exemplary embodiment of the present invention, the organic light-emitting diode display further includes a pixel-defining layer disposed on a first pixel electrode of the first organic light-emitting device and including an opening exposing the first pixel electrode of the first organic light-emitting device.

In an exemplary embodiment of the present invention, the pixel-defining layer further includes an opening exposing a second pixel electrode of the second organic light-emitting device.

In an exemplary embodiment of the present invention, an intermediate layer disposed between a second opposite electrode of the second organic light-emitting device and a second pixel electrode of the second organic light-emitting device includes a same material as that of an intermediate layer disposed between a first opposite electrode of the first organic light-emitting device and a first pixel electrode of the first organic light-emitting device.

In an exemplary embodiment of the present invention, the sensor overlaps the second organic light-emitting device in the second direction. The second direction is substantially perpendicular to an upper surface of the substrate.

In an exemplary embodiment of the present invention, the organic light-emitting diode display further includes an encapsulation member overlapping and sealing the first organic light-emitting device and the second organic light-emitting device. The sensor is disposed on one of the substrate or the encapsulation member.

In an exemplary embodiment of the present invention, an electronic apparatus includes the organic light-emitting diode display.

According to an exemplary embodiment of the present invention, an organic light-emitting diode display includes a substrate including an active area and a dead area surrounding the first area. The organic light-emitting diode display further includes a first organic light-emitting device disposed in the active area, a second organic light-emitting device disposed in the dead area, and an encapsulation member overlapping the first organic light-emitting device and second organic light-emitting device. The organic light-emitting diode display additionally includes a sensor disposed in the dead area facing the second organic light-emitting device and configured to sense light emitted from the second organic light-emitting device. The second organic light-emitting device emits light in a direction towards the sensor.

In an exemplary embodiment of the present invention, the first organic light-emitting device and the second organic light-emitting device emit light in different directions from each other.

In an exemplary embodiment of the present invention, the encapsulation member is a thin encapsulation film including a plurality of inorganic layers and a plurality of organic layers alternatively disposed on one another.

In an exemplary embodiment of the present invention, the organic light-emitting diode display further includes a first thin film transistor connected to the first organic light-emitting device and disposed in the active area, a second thin film transistor connected to the second organic light-emitting device and disposed in dead area, and an insulating layer including an opening and covering the first thin film transistor and the second thin film transistor.

In an exemplary embodiment of the present invention, the second organic light-emitting device includes a first pixel electrode. When the first pixel electrode is disposed below the insulating layer, the sensor is disposed on the substrate in the dead area.

In an exemplary embodiment of the present invention, the second organic light-emitting device includes a first pixel electrode. When the first pixel electrode is disposed above the insulating layer, the sensor is disposed on the encapsulation member in the dead area.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Exemplary embodiments of the present invention will be described more fully hereinafter with reference to the accompanying drawings. It is to be understood that the present invention may, however, be embodied in different forms and thus should not be construed as being limited to the exemplary embodiments set forth herein. In the figures, like reference numerals may refer to like elements.

In the figures, like reference numerals may denote like elements or features.

In the drawings, sizes of elements in the drawings may be exaggerated for clarity.

Figure 1:
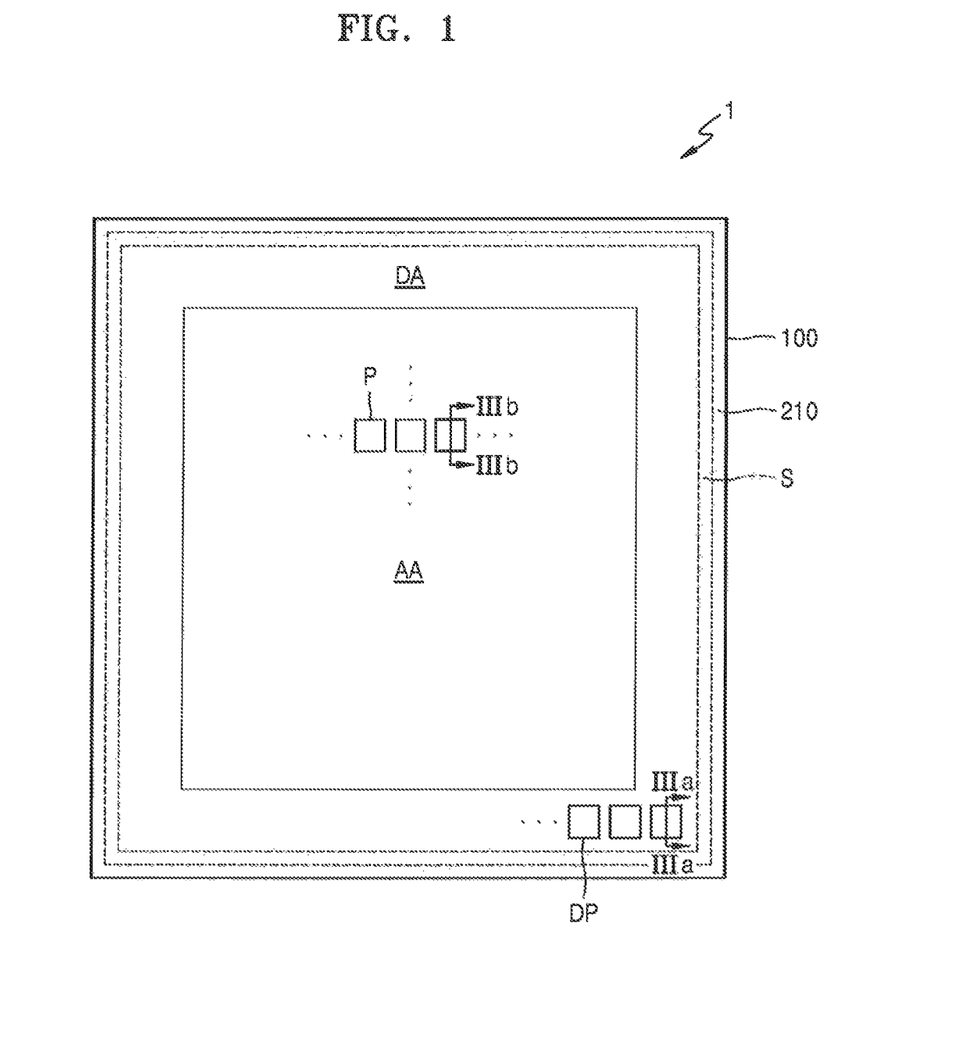
FIG. 1 is a plan view of an organic light-emitting diode display according to an exemplary embodiment of the present invention.
Figure 2A:
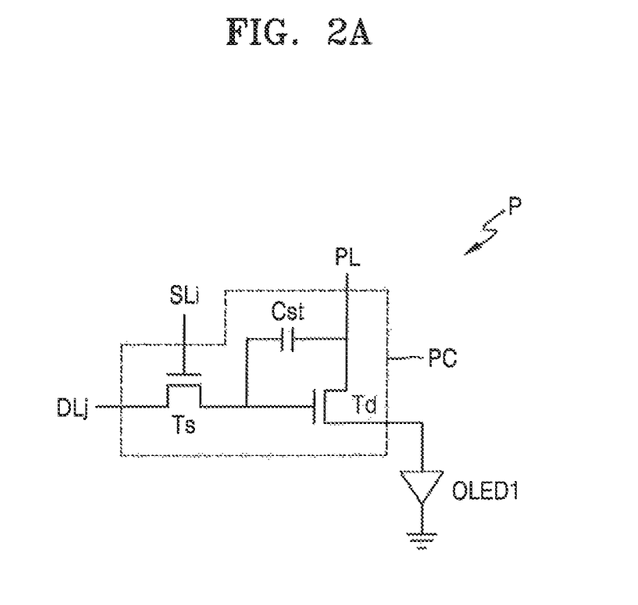
FIG. 2A is a circuit diagram of a pixel according to an exemplary embodiment of the present invention.
Figure 2B:
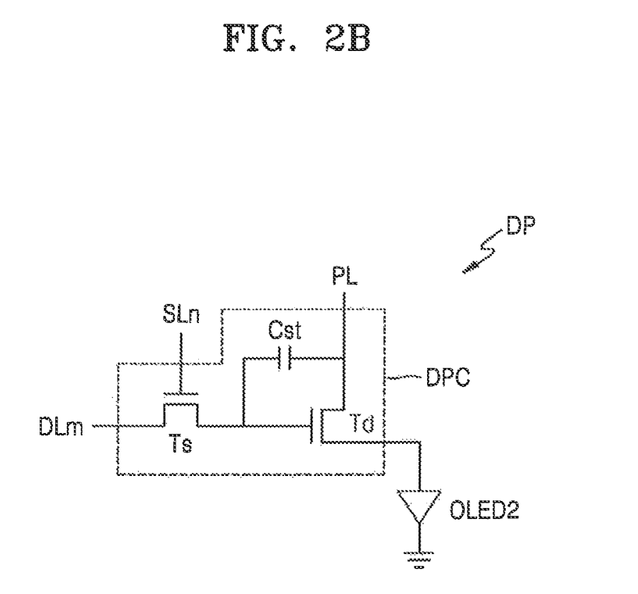
FIG. 2B is a circuit diagram of a dummy pixel according to an exemplary embodiment of the present invention.

It will be understood that when an element is referred to as being "connected" or "coupled" to another element, the element may be directly connected or coupled to the other element or intervening elements FIG. 1 is a plan view of an organic light-emitting diode display 1 according to an exemplary embodiment of the present invention. FIG. 2A is a circuit diagram of a pixel according to an exemplary embodiment of the present invention. FIG. 2B is a circuit diagram of a dummy pixel according to an exemplary embodiment of the present invention.

Referring to FIG. 1, a substrate 100 of the organic light-emitting diode display 1 includes an active area (display area) AA and a dead area (non-display area) DA at least partially surrounding the active area AA. Pixels P are disposed in the active area AA, and the active area AA may display an image. In addition, dummy pixels DP are disposed in the dead area DA.

The pixels P and the dummy pixels DP are sealed by an encapsulation member disposed above the substrate 100. Thus, the pixel P and dummy pixels DP may be protected from oxygen, moisture, and other external impurities. In an exemplary embodiment of the present invention, the encapsulation member may be an encapsulation substrate 210. For example, the encapsulation substrate 210 may overlap the pixels P and dummy pixels DP. A sealing material S may surround the active area AA including the pixels P and a portion of the dead area DA, such as, a portion of the dead area DA in which the dummy pixels DP are arranged. The sealing material S may be disposed between the substrate 100 and the encapsulation substrate 210, and may surround the active area AA. The encapsulation substrate 210 may include, for example, a transparent glass material.

Although the pixels P may be arranged in, for example, a matrix configuration along row and column directions, the present invention is not limited thereto. The pixel P may emit red, green, or blue light.

Referring to FIG. 2A, the pixel P includes a pixel circuit PC and an organic light-emitting device (OLED) 1 (hereinafter referred to as a first OLED). The pixel circuit PC includes a switching thin film transistor (TFT) Ts, a driving TFT Td, and a storage capacitor Cst.

The switching TFT Ts is connected to a scan line SLi and a data line DLj. The switching TFT Ts transfers a data voltage input via the data line DLj to the driving TFT Td in response to a switching voltage input via the scan line SLi. For example, the data voltage input may be provided from a data driver connected to the data line DLj, and the switching voltage input may be provided from a gate driver connected to the scan line SLi.

The driving TFT Td controls a driving current flowing to the first OLED 1, via a driving voltage line PL, in response to a voltage stored in the storage capacitor Cst and the data voltage input. Accordingly, the first OLED 1 may emit light having a predetermined brightness based on the driving current.

The dummy pixel DP is included in the dead area DA and may emit light having the same color as that of the pixel P. For example, the dummy pixel DP may emit red, green, or blue light.

Referring to FIG. 2B, the dummy pixel DP includes a dummy pixel circuit DPC and an OLED 2 (hereinafter referred to as a second OLED). The dummy pixel circuit DPC includes the switching TFT Ts, the driving TFT Td, and the storage capacitor Cst.

The switching TFT Ts is connected to a scan line SLn and a data line DLm. The switching TFT Ts transfers a data voltage input via the data line DLm to the driving TFT Td in response to a switching voltage input via the scan line SLn.

The driving TFT Td controls a driving current flowing to the second OLED 2, via the driving voltage line PL, in response to a voltage stored in the storage capacitor Cst and the data voltage input. Accordingly, the second OLED 2 may emit light having a predetermined brightness based on the driving current.

Light emitted from the dummy pixel DP is received by a sensor 300 (see e.g., FIG. 3), and the received light provides information that is used for compensating for a brightness reduction of the pixel P in the active area AA.

Although FIGS. 2A and 2B describe a case where each of the pixel circuit PC and the dummy pixel circuit DPC includes two TFTs, the present invention is not limited thereto. For example, each of the pixel circuit PC and the dummy pixel circuit DPC may include three or more TFTs.

Figure 3:
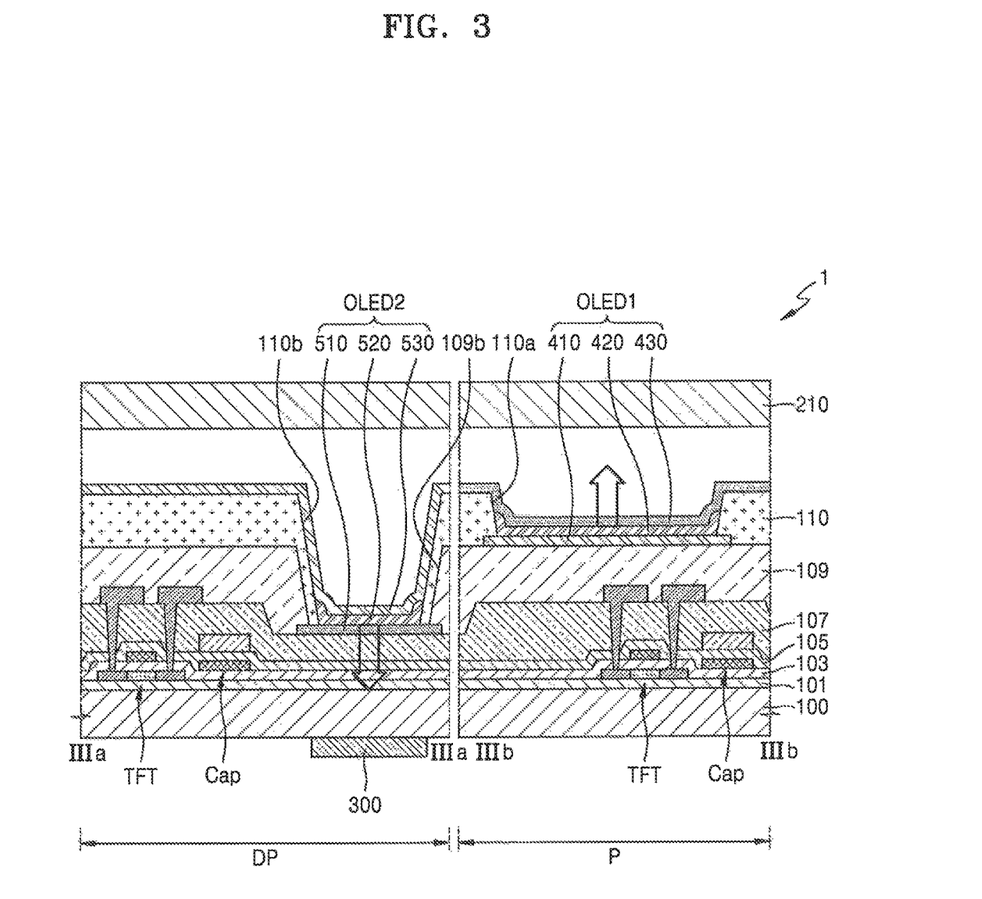
FIG. 3 is a cross-sectional view of the organic light-emitting diode display taken along lines IIIa-IIIa and IIIb-IIIb of FIG. 1 according to an exemplary embodiment of the present invention.

FIG. 3 is a cross-sectional view of the organic light-emitting diode display taken along lines IIIa-IIIa and IIIb-IIIb of FIG. 1 according to an exemplary embodiment of the present invention.

Referring to FIG. 3, the first OLED 1 corresponding to the pixel P has an emission direction of light opposite to that of the second OLED 2 corresponding to the dummy pixel DP. For example, in the case where the first OLED 1 is a top-emission type OLED, the second OLED 2 is a bottom-emission type OLED. Various layers such as layers included in a TFT and layers included in a capacitor Cap may be below the first OLED 1 or the second OLED 2 depending on the type of OLED that the first and second OLEDs 1 and 2 are.

First, the pixel P is described.

The TFT and the capacitor Cap electrically connected to the first OLED 1 are disposed below the first OLED 1. For example, the TFT and the capacitor Cap may be disposed on the substrate 100. The TFT corresponding to the pixel P may correspond to the switching TFT Ts, and the capacitor Cap may correspond to the storage capacitor Cst described with reference to FIG. 2A. Further, the driving TFT Td may have the same structure as that of the TFT of FIG. 3.

The substrate 100 may include a glass material, or a plastic material such as polyethylene terephthalate (PET), polyethylene naphthalate (PEN), and polyimide. A buffer layer 101 may be disposed on the substrate 100 and may prevent impurities from penetrating into a semiconductor layer of the TFT. The buffer layer 101 may include an oxide layer such as silicon oxide (SiOx) and/or a nitride layer such as silicon nitride (SiNx).

A gate insulating layer 103 for insulating the semiconductor layer of the TFT from a gate electrode may be disposed on the buffer layer 101. Further, a dielectric insulating layer 105 may be disposed on the gate insulating layer 103 and may be disposed between both electrodes of the capacitor Cap. An interlayer insulating layer 107 for insulating a source electrode, a drain electrode, and a gate electrode of the TFT may be disposed on the dielectric insulating layer 105. An insulating layer 109 covering the TFT and having a substantially planarized upper surface may be disposed on the interlayer insulating layer 105.

A pixel electrode 410 of the first OLED 1 is disposed on the insulating layer 109. The pixel electrode 410 may be a reflective electrode. The pixel electrode 410 may include a reflective layer including for example, silver (Ag), magnesium(Mg), aluminum (Al), platinum (Pt), palladium (Pd), gold (Au), nickel (Ni), neodymium (Nd), iridium (Ir), chromium (Cr), or a compound thereof. In an exemplary embodiment of the present invention, the pixel electrode 410 may further include a transparent conductive oxide (TCO) layer such as indium tin oxide (ITO), indium zinc oxide (IZO), zinc oxide (ZnO), or indium oxide ($In_2O_3$) disposed over the reflective layer, but the present invention is not limited thereto.

A pixel-defining layer 110 of the first OLED 1 may be disposed on the pixel electrode 410 and includes an opening 110a exposing the pixel electrode 410. An intermediate layer 420 including an organic emission layer is disposed on the pixel electrode 410 exposed via the opening 110a.

The intermediate layer 420 of the first OLED 1 includes an organic emission layer emitting red, green, or blue light. The intermediate layer 420 may further include a functional layer such as a hole transport layer (HTL), a hole injection layer (HIL), an electron transport layer (ETL), and an electron injection layer (EIL).

An opposite electrode 430 of the first OLED 1 is a transparent electrode and may be disposed on the intermediate layer 420. The opposite electrode 430 may include a thin metallic layer including Ag, Mg, or an alloy thereof, or may include a layer including a TCO such as ITO, IZO, ZnO, or $In_2O_3$. In addition, the opposite electrode 430 may further include the layer including a TCO disposed over the thin metallic layer. However, the material of the opposite electrode 430 is not limited thereto.

The above-described first OLED 1 including the pixel electrode 410, the intermediate layer 420, and the opposite electrode 430 emits light toward the encapsulation substrate 210.

Next, the dummy pixel DP is described.

The second OLED 2 is connected to a TFT and a capacitor Cap disposed on the substrate 100. The TFT corresponding to the dummy pixel DP may correspond to the switching TFT Ts, and the capacitor Cap may correspond to the storage capacitor Cst described with reference to FIG. 2B. Further, the driving TFT Td may have the same structure as that of the TFT of FIG. 3.

The TFT and the capacitor Cap of the dummy pixel DP may be disposed in one region of the dummy pixel DP, and the second OLED 2 may be disposed in another region. For example, the two regions may be next to each other in a lateral direction.

The first OLED 1 may be a top-emission type OLED and may overlap the pixel circuit PC (e.g. the TFT and the capacitor Cap of the pixel P) such that an aperture ratio of the first OLED 1 may be increased. In contrast, the second OLED 2 may be a bottom-emission type OLED and the second OLED 2 might not overlap the dummy pixel circuit DPC (e.g. the TFT and the capacitor Cap of the dummy pixel DP).

A pixel electrode 510 of the second OLED 2 may be disposed under the insulating layer 109 including an opening 109b and the pixel defining layer 110 including an opening 110b. Since only the insulating layers (e.g., the gate insulating layer 103, the dielectric insulating layer 105, and the interlayer insulating layer 107) are between the substrate 100 and the pixel electrode 510 of the second OLED 2 and the TFT and the capacitor Cap are not disposed between the substrate 100 and the pixel electrode 510, a distance between the substrate 100 and the pixel electrode 510 of the second OLED 2 may be less than a distance between the substrate 100 and the pixel electrode 410 of the first OLED 1.

The pixel electrode 510 may be a transparent electrode. The pixel electrode 510 may include for example, ITO, IZO, ZnO, $In_2O_3$, indium gallium oxide (IGO), and/or aluminum zinc oxide (AZO). However, the material of the pixel electrode 510 is not limited thereto.

The pixel electrode 510 is exposed via openings 109b and 110b respectively provided in the insulating layer 109 and the pixel-defining layer 110. The pixel defining layer 110 may be disposed in the opening 109b such that the opening 110b of the pixel-defining layer 110 corresponds to the opening 109b of the insulating layer 109 to expose the pixel electrode 510.

An intermediate layer 520 may be disposed on the pixel electrode 510. The intermediate layer 520 includes an organic emission layer emitting red, green, or blue light. The intermediate layer 520 may further include a functional layer such as an HTL, an HIL, an ETL, and/or an EIL.

To reflect a change in brightness of the first OLED 1 of the pixel P, the intermediate layer 520 of the second OLED 2 includes the same material as that of the intermediate layer 420 of the first OLED 1.

An opposite electrode 530 is a reflective electrode. The opposite electrode 530 may include a layer including at least one of lithium (Li), calcium (Ca), lithium fluoride/calcium (LiF/Ca), lithium fluoride/aluminum (LiF/Al), Al, Ag, and Mg, but the material of the opposite electrode 530 is not limited thereto.

The second OLED 2 including the pixel electrode 510, the intermediate layer 520, and the opposite electrode 530 emits light toward the substrate 100. The emitted light is received by the sensor 300 disposed on the substrate 100. For example, the sensor 300 may be disposed on a second surface of the substrate 100 which is opposite to a first surface of the substrate 100 on which the second OLED 2 is formed. In addition, the sensor 300 may overlap the second OLED 2. For example, the sensor 300 may overlap the second OLED 2 in a direction substantially perpendicular to an upper surface of the substrate 100.

In an exemplary embodiment of the present invention, the sensor 300 may be disposed on the substrate 100 when the pixel electrode 510 of the second OLED 2 is disposed below the insulating layer 109.

Since the intermediate layer 520 of the second OLED 2 includes the same material, for example the same organic material, as that of the intermediate layer 420 of the first OLED 1, light emitted from the second OLED 2 and received by the sensor 300 is used for measuring a deterioration degree of the first OLED 1. The organic light-emitting diode display 1 may generate a signal for compensating for a brightness reduction in response to a degree of deterioration based on light received by the sensor 300. Accordingly, display quality may be improved.

According to an exemplary embodiment of the present invention, since most of the light emitted from the second OLED 2 is used for sensing the deterioration degree of the first OLED 1, brightness reduction by the deterioration of the OLED 1 may be sensed.

In a comparative example, a method of sensing a portion of light emitted from the first OLED 1, for example light emitted in the lateral direction of the OLED 1, and compensating for a brightness reduction may be considered. However, since most of the light emitted from the OLED 1 progresses toward a perpendicular direction of the substrate 100 (e.g., from the substrate 100 to the encapsulation substrate 210), an amount of light emitted in the lateral direction is relatively small and a portion of the light emitted in the lateral direction is absorbed and lost. Thus, sensing efficiency is reduced. However, according to an exemplary embodiment of the present invention, since the second OLED 2 of the dummy pixel DP including an organic material (e.g., organic emission layer) the same as that of the first OLED 1 of the pixel P is provided and since most of light emitted from the second OLED 2 is used for sensing the deterioration of the first OLED 1, as described above, the sensing efficiency of deterioration of the first OLED 1 may be increased and the compensation for the brightness reduction may be better performed.

Although FIG. 3 describes a case where a TFT electrically connected to the OLED 1 is disposed in the active area and a TFT electrically connected to the OLED 2 is disposed in the dead area, the present invention is not limited. In an exemplary embodiment of the present invention, the TFT electrically connected to the OLED 2 may be disposed in the active area.

Figure 4:
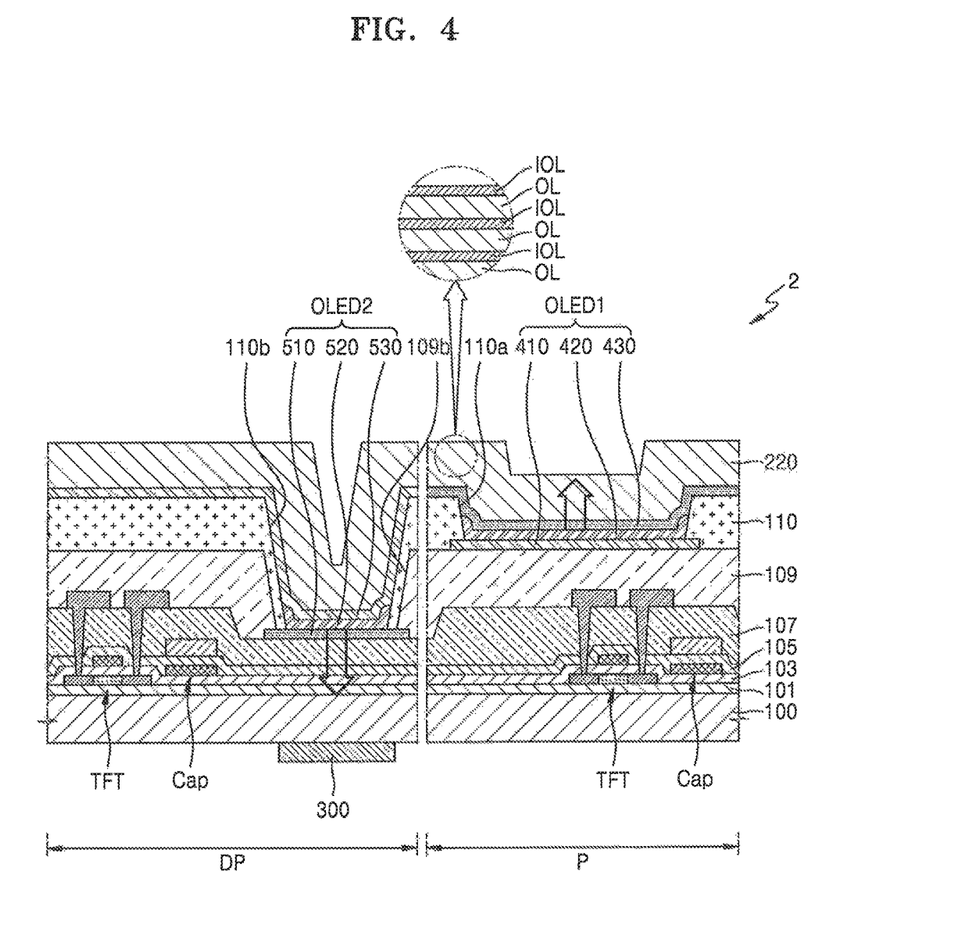
FIG. 4 is a cross-sectional view of an organic light-emitting diode display according to an exemplary embodiment of the present invention.

FIG. 4 is a cross-sectional view of an organic light-emitting diode display 2 according to an exemplary embodiment of the present invention.

Referring to FIG. 4, unlike the organic light-emitting diode display 1, the organic light-emitting diode display 2 may include a thin encapsulation film 220 as an encapsulation member. The thin encapsulation film 220 may be disposed above the first OLED 1 and the second OLED 2. The thin encapsulation film 220 may include at least one organic layer OL and at least one inorganic layer IOL. In an exemplary embodiment of the present invention, although an enlarged section of FIG. 4 illustrates a structure in which organic layers OL and inorganic layers IOL are alternatively stacked on one another, the present invention is not limited thereto. For example, a stacking order and a number of the organic layers OL and the inorganic layers IOL may change.

FIGS. 5A to 5E are cross-sectional views illustrating a process of manufacturing the first and second OLEDs 1 and 2 of an organic light-emitting diode display 1 and 2 according to an exemplary embodiment of the present invention.

Figure 5A:
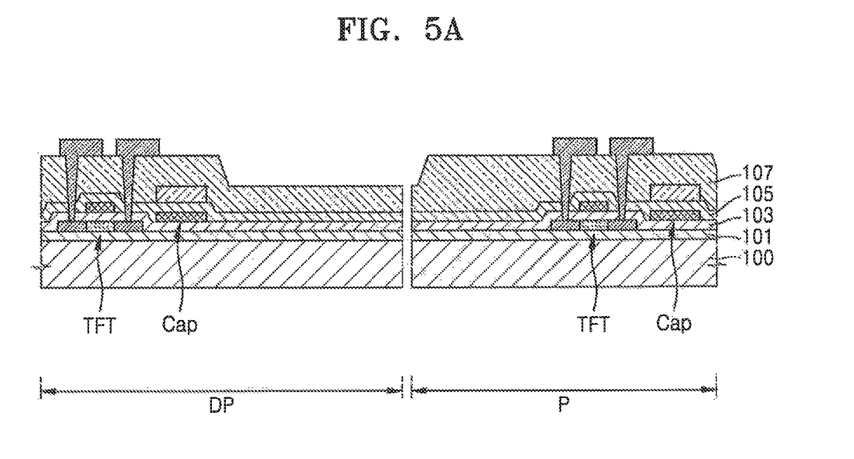
FIGS. 5A to 5F are cross-sectional views illustrating a process of manufacturing first and second organic light-emitting devices (OLEDs) of an organic light-emitting diode display according to an exemplary embodiment of the present invention.

FIG. 5A illustrates first to fifth mask processes.

Referring to FIG. 5A, the buffer layer 101 is formed on the substrate 100, and the TFTs and the capacitors Cap are formed on the buffer layer 101.

In an exemplary embodiment of the present invention, a semiconductor material layer may be disposed on the buffer layer 101. A semiconductor layer of the TFTs is formed at locations corresponding to the pixel P and the dumpy pixel DP by patterning the semiconductor material layer (hereinafter referred to as a first mask process), and a gate insulating layer 103 may be formed on the semiconductor layer.

A metallic material layer may be disposed over the gate insulating layer 103. Gate electrodes of the TFTs and lower electrodes of the capacitors Cap are formed at locations corresponding to the pixel P and the dummy pixel DP by patterning the metallic material layer (hereinafter referred to as a second mask process), and the dielectric insulating layer 105 is formed on the gate electrodes of the TFTs and the lower electrodes of the capacitors Cap.

A metallic material layer is disposed over the dielectric insulating layer 105. Upper electrodes of the capacitors Cap are formed at locations corresponding to the pixel P and the dummy pixel DP by patterning the metallic material layer (hereinafter referred to as a third mask process), and an interlayer insulating layer 107 is formed on the upper electrodes of the capacitors Cap.

After that, contact holes exposing portions of the semiconductor layer of the TFTs are formed by patterning the interlayer insulating layer 107, the dielectric insulating layer 105, and the gate insulating layer 103 (hereinafter referred to as a fourth mask process). A metallic material layer is disposed in the contact holes. Source electrodes and drain electrodes of the TFTs are formed by patterning the metallic material layer (hereinafter referred to as a fifth mask process).

Figure 5B:
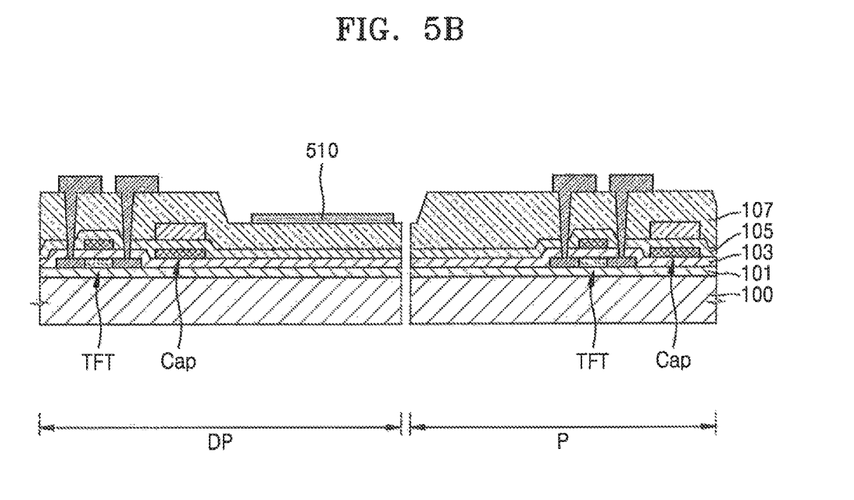

FIG. 5B illustrates a sixth mask process.

Referring to FIG. 5B, the pixel electrode 510 is formed on a portion of the interlayer insulating layer 107 corresponding to the dummy pixel DP. The pixel electrode 510 may be formed by disposing a transparent material layer on the interlayer insulating layer 107 and patterning the transparent material layer.

Although the pixel electrode 510 of the dummy pixel DP is a transparent electrode and may include, for example, ITO, IZO, ZnO, In$_2$O$_3$, IGO, or AZO, the material of the pixel electrode 510 is not limited thereto.

Figure 5C:
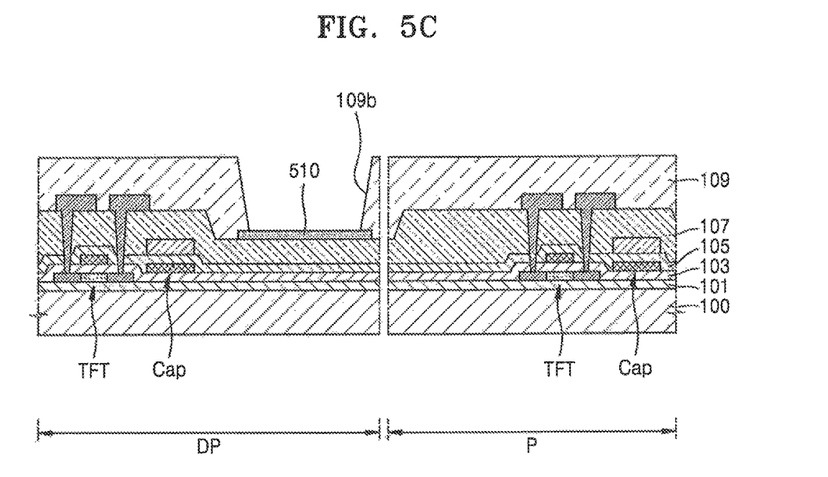

FIG. 5C illustrates a seventh mask process.

Referring to FIG. 5C, the insulating layer 109 is formed over the substrate 100, and the insulating layer 109 is patterned to form the opening 109b to expose the pixel electrode 510 of the dummy pixel DP. The insulating layer 109 may include an organic material. In an exemplary embodiment of the present invention, the insulating layer 109 may include an inorganic material.

Figure 5D:
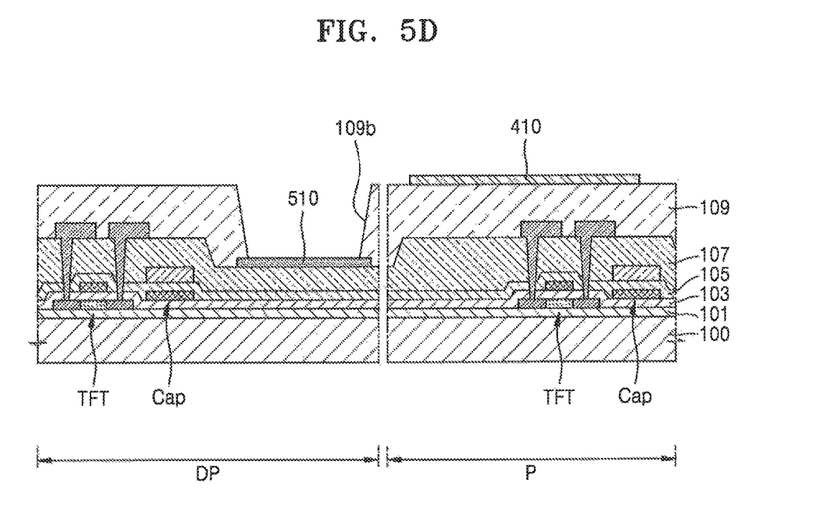

FIG. 5D illustrates an eighth mask process.

Referring to FIG. 5D, the pixel electrode 410 of the pixel P may be formed on the insulating layer 109. The pixel electrode 410 may be formed by disposing a reflective material layer on the insulating layer 109 and pattering the reflective material layer.

The pixel electrode 410 of the pixel P may include a reflective layer including, for example, Ag, Mg, Al, Pt, Pd, Au, Ni, Nd, Ir, Cr, or a compound thereof. In addition, the pixel electrode 410 may further include a TCO layer such as ITO, IZO, ZnO, or In$_2$O$_3$ over the reflective layer. However, the material of the pixel electrode 410 is not limited thereto.

Figure 5E:
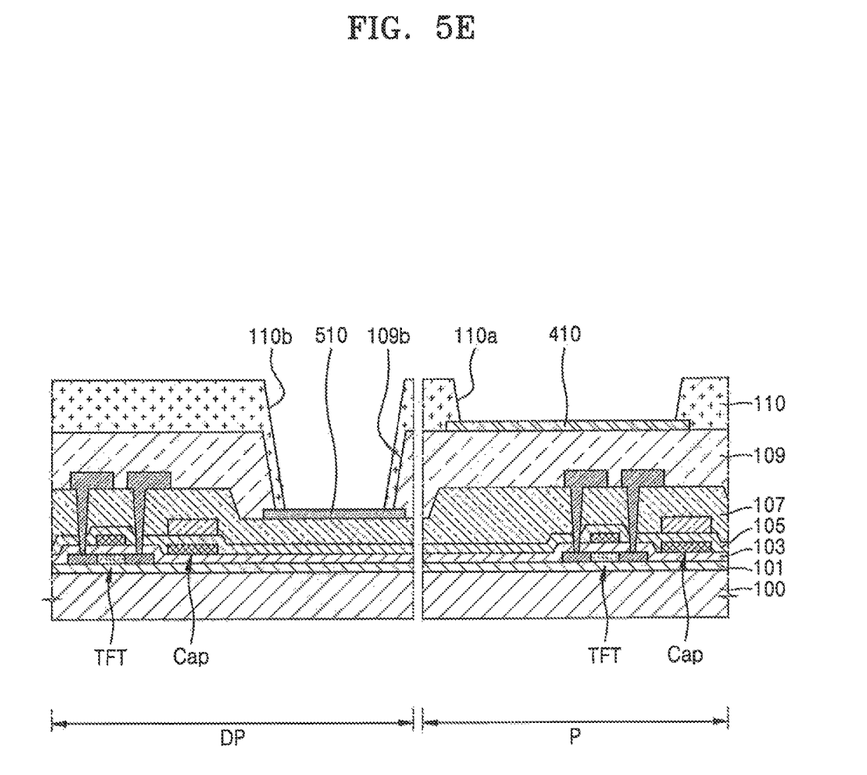

FIG. 5E illustrates a ninth mask process.

Referring to FIG. 5E, the pixel-defining layer 110 is formed over the substrate 100, and the openings 110a and 110b respectively exposing the pixel electrode 410 of the pixel P and the pixel electrode 510 of the dummy pixel DP may be formed by patterning the pixel-defining layer 110. The pixel-defining layer 110 may be formed on the insulating layer 109, and the opening 110b of the pixel-defining layer 110 corresponding to the dummy pixel DP corresponds to the opening 109b of the insulating layer 109 and exposes the pixel electrode 510. The pixel-defining layer 110 may include an organic material.

Figure 5F:
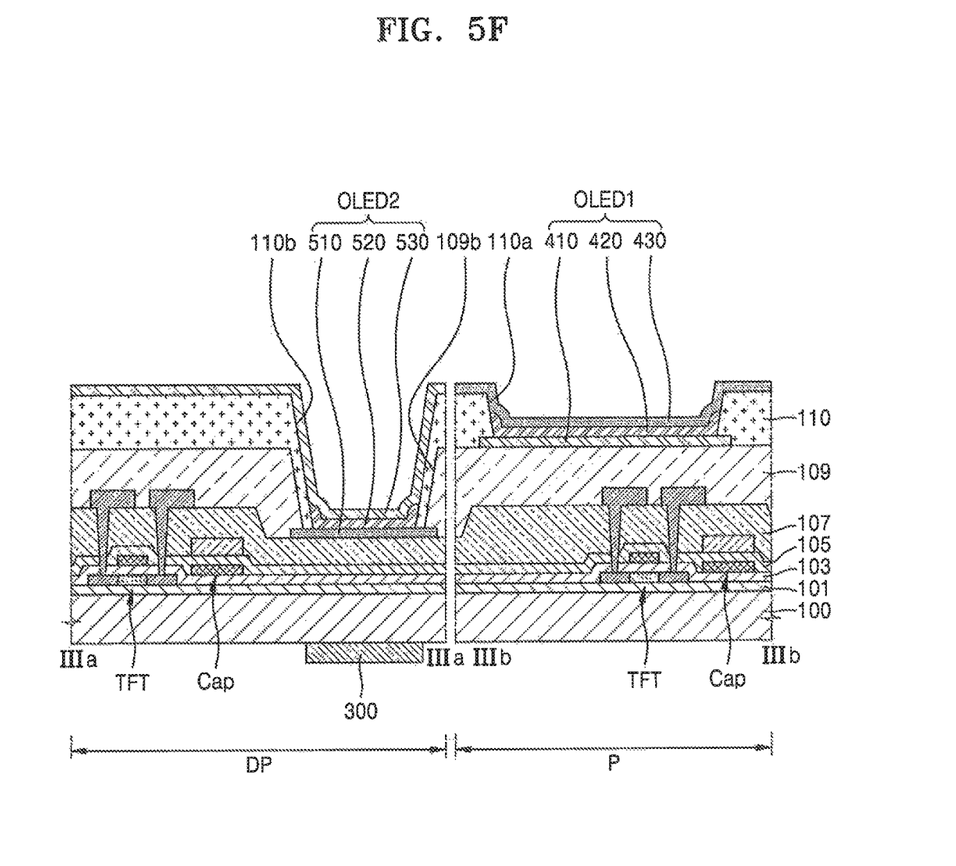

FIG. 5F illustrates a process of forming an intermediate layer 420 and 520 and a process of forming an opposite electrode 430.

Referring to FIG. 5F, the intermediate layers 420 and 520 are respectively formed on the pixel electrode 410 of the pixel P and the pixel electrode 510 of the dummy pixel DP. The intermediate layer 420 of the pixel P includes the same material as that of the intermediate layer 520 of the dummy pixel DP.

After that, the opposite electrode 430 is formed on the intermediate layer 420 of the pixel P. The opposite electrode 430 of the pixel P is a transparent electrode and may include a thin metallic layer including, for example, Ag, Mg, or an alloy thereof, or may include a layer including a TCO such as ITO, IZO, ZnO, or In$_2$O$_3$. In addition, the opposite electrode 430 may further include a layer including a TCO disposed over the thin metallic layer, but the present invention is not limited thereto. For example, the material of the opposite electrode 430 may change variously.

The opposite electrode 530 is formed on the intermediate layer 520 of the dummy pixel DP. The opposite electrode 530 of the dummy pixel DP is a reflective electrode and may include a layer including at least one of, for example, Li, Ca, LiF/Ca, LiF/Al, Al, Ag, and Mg, but the material of the opposite electrode 530 is not limited thereto.

Although the exemplary embodiment of the present invention has described a case of forming the opposite electrode 430 on the intermediate layer 420 of the pixel P and forming the opposite electrode 530 on the intermediate layer 520 of the dummy pixel DP, the order may change.

Figure 6:
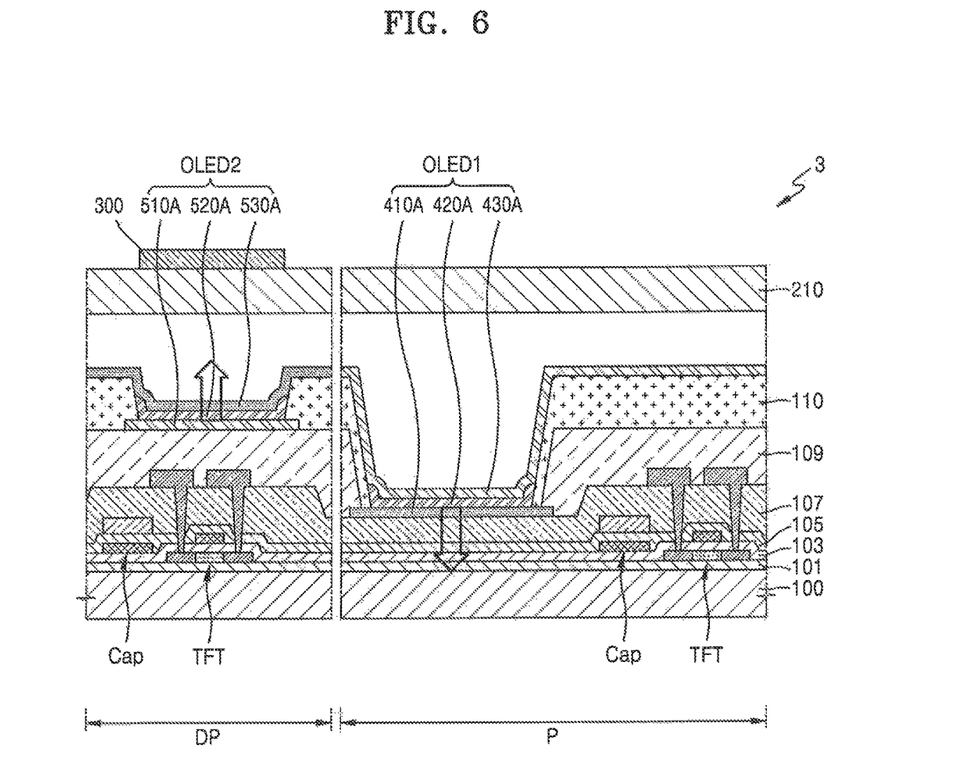
FIG. 6 is a cross-sectional view of an organic light-emitting diode display according to an exemplary embodiment of the present invention.

FIG. 6 is a cross-sectional view of an organic light-emitting diode display 3 according to an exemplary embodiment present invention.

Referring to FIG. 6, the organic light-emitting diode display 3 may be different from the above-described organic light-emitting diode display 1 in that the first OLED 1 of the pixel P is a bottom-emission type OLED, and the second OLED 2 of the dummy pixel DP is a top-emission type OLED. Thus, the sensor 300 is disposed on the encapsulation substrate 210. For example, the sensor 300 may overlap the second OLED 2 in a direction substantially perpendicular to an upper surface of the substrate 100. As an example, the sensor 300 may be disposed on the encapsulation substrate 210 when a pixel electrode 510A of the second OLED 2 is disposed above the insulating layer 109.

In the pixel P, only insulating layers are disposed between the pixel electrode 410A of the first OLED 1 and the substrate 100, and a TFT and a capacitor Cap are not disposed between the pixel electrode 410A of the first OLED 1 and the substrate 100. For example, the first OLED 1 is in a first region of the pixel P, and the TFT and capacitor Cap are in a second region next to the first region in a lateral direction. In contrast, in the dummy pixel DP, a TFT and a capacitor Cap may be disposed between a pixel electrode 510A of the second OLED 2 and the substrate 100. Therefore, a distance from the substrate 100 to the pixel electrode 410A of the first OLED 1 may be less than a distance from the substrate 100 to the pixel electrode 510A of the second OLED 2.

The pixel electrode 410A of the first OLED 1 of the pixel P may be a transparent electrode, and an opposite electrode 430A of the first OLED 1 may be a reflective electrode. The pixel electrode 410A of the first OLED 1 may include, for example, ITO, IZO, ZnO, In2O3, IGO, or AZO, but the material of the pixel electrode 410A is not limited thereto. The opposite electrode 430A of the first OLED 1 may be a reflective electrode including a layer including at least one of, for example, Li, Ca, LiF/Ca, LiF/Al, Al, Ag, and Mg, but the material of the opposite electrode 430A is not limited thereto.

The pixel electrode 510A of the second OLED 2 of the dummy pixel DP may be a reflective electrode, and an opposite electrode 530A of the second OLED 2 may be a transparent electrode. The pixel electrode 510A of the second OLED 2 may include a reflective layer including, for example, Ag, Mg, Al, Pt, Pd, Au, Ni, Nd, Ir, Cr, or a compound thereof, or may further include a TCO layer disposed over the above-described reflective layer. The material of the pixel electrode 510A may change variously. The opposite electrode 530A of the second OLED 2 may be a thin metallic layer including Ag, Mg, or an alloy thereof, or may be a layer including a TCO such as ITO, IZO, ZnO, or $In_2O_3$. The opposite electrode 530A may further include a layer including a TCO disposed over the thin metallic layer. However, the material of the opposite electrode 530A may change variously.

An intermediate layer 420A of the first OLED 1 includes the same material as that of an intermediate layer 520A of the second OLED 2.

The intermediate layers 420A and 520A include an organic emission layer for emitting red, green, or blue light. The intermediate layers 420A and 520A may include a functional layer such as an NTL, an HIL, an ETL, and/or EIL.

Although FIG. 6 illustrates the structure in which the encapsulation substrate 210 is disposed over the first and second OLEDs 1 and 2, the present invention is not limited thereto. As described with reference to FIG. 4, the thin encapsulation film 220 including at least one organic layer OL and at least one inorganic layer IOL may be used as the encapsulation member.

Although FIG. 6 describes a case where a TFT electrically connected to the OLED 1 is disposed in the active area and a TFT electrically connected to the OLED 2 is disposed in the dead area, the present invention is not limited. In an exemplary embodiment of the present invention, the TFT electrically connected to the OLED 2 may be disposed in the active area.

Figure 7A:
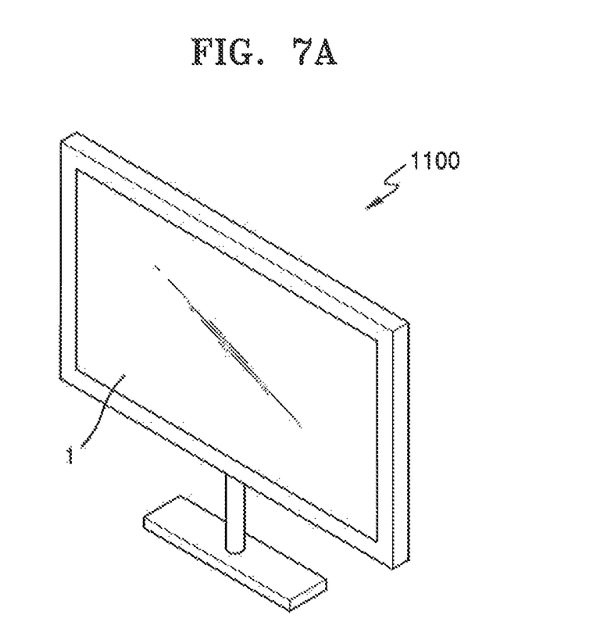
FIGS. 7A to 7C are perspective views of an electronic apparatuses including an organic light-emitting diode display.
Figure 7B:
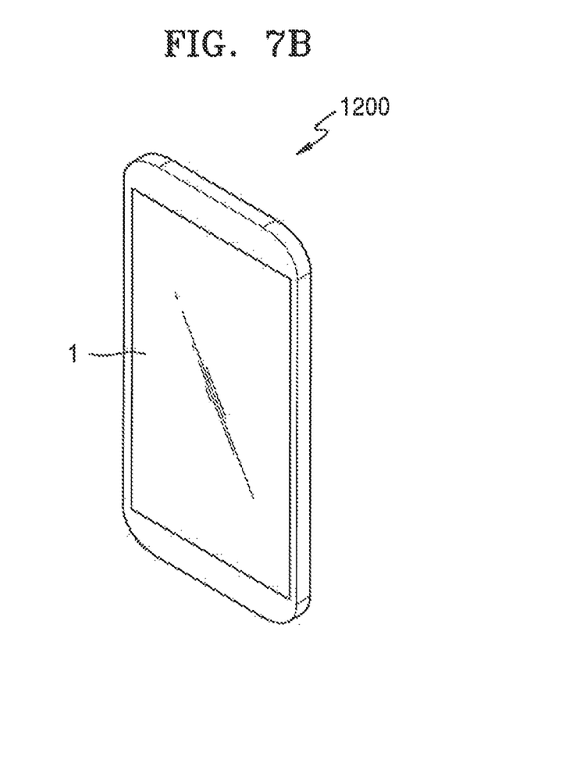
Figure 7C:
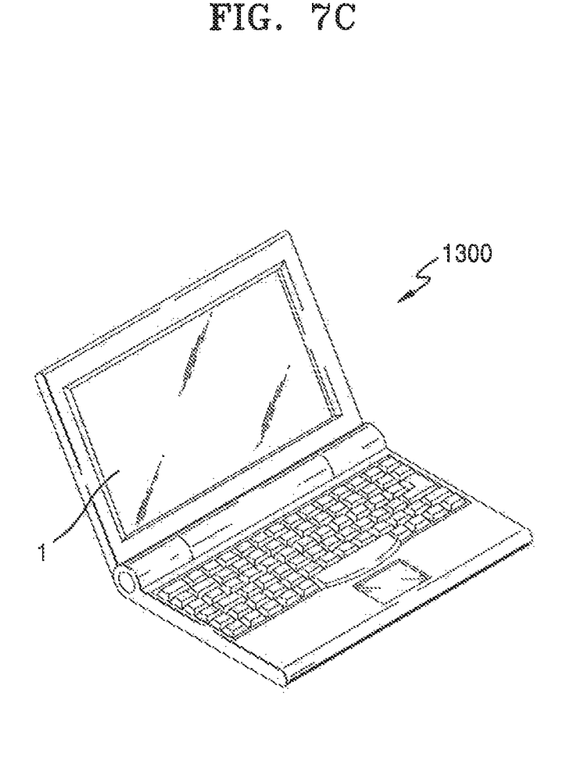

FIGS. 7A to 7C are perspective views of an electronic apparatuses including an organic light-emitting diode display 1, 2, and 3.

The organic light-emitting diode display 1 according to an exemplary embodiment of the present invention described with reference to FIGS. 1 to 3 and the organic light-emitting diode displays 2 and 3 according to an exemplary embodiment of the present invention described with reference to FIGS. 4 to 6 may be included in a display apparatuses such as a television (TV) 1100 illustrated in FIG. 7A and may provide various images. In addition, the organic light-emitting diode displays 1, 2, and 3 may be included in portable electronic devices such as a mobile phone 1200 illustrated in FIG. 7B or a notebook computer 1300 illustrated in FIG. 7C, and may provide various images.

Since electronic apparatuses such as the TV 1100, the mobile phone 1200, and the notebook computer 1300 include the above-described organic light-emitting diode display 1, 2, and 3, they sense light and compensate for brightness of pixels P by generating a signal for compensating for the brightness by using dummy pixels DP and a sensor 300. Accordingly, the electronic apparatuses may provide images with a high display quality over a long period of time.

Although FIGS. 7A to 7C illustrate the TV 1100, the mobile phone 1200, and the notebook computer 1300 as electronic apparatuses, the present invention is not limited thereto. The present invention is meant to include any electronic apparatus including an organic light-emitting diode display. For example, the electronic apparatuses may include computer monitors, tablet personal computers (PCs), smart watches and other wearable devices, etc.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. An organic light-emitting diode display comprising:
   a substrate comprising an active area and a dead area surrounding the active area;
   a first organic light-emitting device disposed in the active area;
   a second organic light-emitting device disposed in the dead area;
   a sensor configured to sense light emitted from the second organic light-emitting device,
   wherein the first organic light-emitting device emits light in a first direction, and the second organic light-emitting device emits light in a second direction that is opposite to the first direction and is toward the sensor;
   an interlayer insulating layer disposed on the substrate; and
   an insulating layer disposed on the interlayer insulating layer, wherein one of a first pixel electrode of the first organic light-emitting device or a second pixel electrode of the second organic light-emitting device is disposed between the insulating layer and the interlayer insulating layer, and the other one of the first pixel electrode and the second pixel electrode is not disposed between the insulating layer and the interlayer insulating layer.

2. The organic light-emitting diode display of claim 1, wherein the first pixel electrode of the first organic light-emitting device comprises a material different from that of the second pixel electrode of the second organic light-emitting device.

3. The organic light-emitting diode display of claim 1, wherein a first distance from the substrate to the first pixel electrode of the first organic light-emitting device is different from a second distance from the substrate to the second pixel electrode of the second organic light-emitting device.

4. The organic light-emitting diode display of claim 1, further comprising:
   a first thin film transistor connected to the first organic light-emitting device, wherein
   the insulating layer covers the first thin film transistor.

5. The organic light-emitting diode display of claim 4, wherein one of the first pixel electrode of the first organic light-emitting device or the second pixel electrode of the second organic light-emitting device is disposed on the insulating layer, and another pixel electrode of the first pixel electrode and the second pixel electrode is disposed under the insulating layer.

6. The organic light-emitting diode display of claim 5, wherein the insulating layer comprises an opening exposing the remaining pixel electrode disposed under the insulating layer.

7. The organic light-emitting diode display of claim 4, further comprising a second thin film transistor connected to the second organic light-emitting device, the second thin film transistor being covered by the insulating layer.

8. The organic light-emitting diode display of claim 7, wherein a gate electrode, a source electrode, and a drain electrode of the second thin film transistor respectively comprise same materials as those of a gate electrode, a source electrode, and a drain electrode of the first thin film transistor.

9. The organic light-emitting diode display of claim 1, further comprising a pixel-defining layer disposed on the first pixel electrode of the first organic light-emitting device and comprising an opening exposing the first pixel electrode of the first organic light-emitting device.

10. The organic light-emitting diode display of claim 9, wherein the pixel-defining layer further comprises an opening exposing the second pixel electrode of the second organic light-emitting device.

11. The organic light-emitting diode display of claim 1, wherein an intermediate layer disposed between a second opposite electrode of the second organic light-emitting device and the second pixel electrode of the second organic light-emitting device comprises a same material as that of an intermediate layer disposed between a first opposite electrode of the first organic light-emitting device and the first pixel electrode of the first organic light-emitting device.

12. The organic light-emitting diode display of claim 1, wherein the sensor overlaps the second organic light-emitting device in the second direction, wherein the second direction is substantially perpendicular to an upper surface of the substrate.

13. The organic light-emitting diode display of claim 12, further comprising an encapsulation member overlapping and sealing the first organic light-emitting device and the second organic light-emitting device, wherein the sensor is disposed on one of the substrate or the encapsulation member.

14. An electronic apparatus comprising an organic light-emitting diode display, wherein the organic light-emitting diode display comprises:
    a substrate comprising an active area and a dead area surrounding the active area;
    a first organic light-emitting device disposed in the active area;
    a second organic light-emitting device disposed in the dead area;
    a sensor configured to sense light emitted from the second organic light-emitting device,
    wherein the first organic light-emitting device emits light in a first direction, and the second organic light-emitting device emits light in a second direction that is opposite to the first direction;
    an interlayer insulating layer disposed on the substrate; and
    an insulating layer disposed on the interlayer insulating layer, wherein one of a first pixel electrode of the first organic light-emitting device or a second pixel electrode of the second organic light-emitting device is disposed between the insulating layer and the interlayer insulating layer, and the other one of the first pixel electrode and the second pixel electrode is not disposed between the insulating layer and the interlayer insulating layer.

15. An organic light-emitting diode display comprising:
    a substrate comprising an active area and a dead area surrounding the active area;
    a first organic light-emitting device disposed in the active area and comprising a first pixel electrode;
    a second organic light-emitting device disposed in the dead area and comprising a second pixel electrode;
    a first thin film transistor;
    a second thin film transistor, wherein the second pixel electrode is directly disposed on a same layer as a source electrode and a drain electrode of the second thin film transistor, and the first pixel electrode is disposed on a layer different from that of the second pixel electrode;
    an encapsulation member overlapping the first organic light-emitting device and the second organic light-emitting device; and
    a sensor disposed in the dead area facing the second organic light-emitting device and configured to sense light emitted from the second organic light-emitting device,
    wherein the second organic light-emitting device emits light in a direction towards the sensor.

16. The organic light-emitting diode display of claim 15, wherein the first organic light-emitting device and the second organic light-emitting device emit light in different directions from each other.

17. The organic light-emitting diode display of claim 15, wherein the encapsulation member is a thin encapsulation film including at least one inorganic layer and at least one organic layer.

18. The organic light-emitting diode display of claim 15, further comprising:
    an insulating layer including an opening and covering the first thin film transistor and the second thin film transistor, wherein the first thin film transistor is connected to the first organic light-emitting device and is disposed in the active area, and the second thin film transistor is connected to the second organic light-emitting device and is disposed in the dead area.

19. The organic light-emitting diode display of claim 18, wherein when the second pixel electrode is disposed below the insulating layer, the sensor is disposed on the substrate in the dead area.

20. The organic light-emitting diode display of claim 18, wherein when the second pixel electrode is disposed above the insulating layer, the sensor is disposed on the encapsulation member in the dead area.

21. The organic light-emitting diode display of claim 15, wherein the first pixel electrode is disposed above a source electrode and drain electrode of the first thin film transistor.

* * * * *